United States Patent
Bandyopadhyay et al.

[11] Patent Number: 5,827,776
[45] Date of Patent: Oct. 27, 1998

[54] METHOD OF MAKING AN INTEGRATED CIRCUIT WHICH USES AN ETCH STOP FOR PRODUCING STAGGERED INTERCONNECT LINES

[75] Inventors: Basab Bandyopadhyay; H. Jim Fulford, Jr.; Robert Dawson; Fred N. Hause; Mark W. Michael; William S. Brennan, all of Austin, Tex.

[73] Assignee: Advanced Micro Devices, Inc.

[21] Appl. No.: 959,106

[22] Filed: Oct. 23, 1997

Related U.S. Application Data

[63] Continuation of Ser. No. 683,176, Jul. 18, 1996, abandoned.

[51] Int. Cl.$^6$ ................................................. H01L 21/4763
[52] U.S. Cl. .......................... 438/624; 438/622; 438/634; 438/637; 438/700; 438/734; 438/738; 438/740
[58] Field of Search .................. 437/195, 190, 437/228; 438/622, 624, 634, 637, 700, 734, 738, 740

[56] References Cited

U.S. PATENT DOCUMENTS

| | | | |
|---|---|---|---|
| 4,832,789 | 5/1989 | Cochran et al. | 438/639 |
| 4,987,099 | 1/1991 | Flanner | 438/639 |
| 4,996,133 | 2/1991 | Brighton et al. | 430/313 |
| 5,010,039 | 4/1991 | Ku et al. | 437/228 |
| 5,034,347 | 7/1991 | Kakihana | 438/740 |
| 5,204,286 | 4/1993 | Doan | 438/639 |
| 5,244,534 | 9/1993 | Yu et al. . | |
| 5,286,675 | 2/1994 | Chen et al. | 438/639 |
| 5,300,456 | 4/1994 | Tigelaar et al. | 438/639 |
| 5,312,777 | 5/1994 | Cronin et al. | 437/195 |
| 5,328,553 | 7/1994 | Poon | 156/636 |
| 5,354,711 | 10/1994 | Heitzmann et al. | 437/182 |
| 5,530,262 | 6/1996 | Cronin et al. | 257/10 |
| 5,635,423 | 6/1997 | Huang et al. | 438/624 |
| 5,726,100 | 3/1998 | Given | 438/740 |
| 5,728,619 | 3/1998 | Tsai et al. | 438/297 |
| 5,741,741 | 4/1998 | Tseng | 438/700 |
| 5,753,565 | 5/1998 | Becker | 438/586 |
| 5,759,911 | 6/1998 | Cronin et al. | 438/622 |
| 5,759,914 | 6/1998 | Park | 438/624 |

OTHER PUBLICATIONS

IBM Technical Disclosure Bulletin entitled, "Damascene: Optimized Etch Stop Structure and Method," vol. 36, No. 11, p. 649.
IBM Technical Disclosure Bulletin entitled, "Displaced Metal Conductor," vol. 36, No. 11, pp. 599–602.
International Search Report for PCT/US 97/09452, dated Oct. 3, 1997.

*Primary Examiner*—Jey Tsai
*Assistant Examiner*—Lynne A. Gurley
*Attorney, Agent, or Firm*—Kevin L. Daffer; Conley, Rose & Tayon

[57] ABSTRACT

A multilevel interconnect structure is provided. The multilevel interconnect structure includes at least three levels of interconnect (conductors) formed according to one exemplary embodiment. Two of the three levels of conductors are staggered from each other in separate vertical and horizontal planes. A third conductor is advantageously spaced a lateral distance between at least a portion of two second conductors. The third conductor is also placed in an elevational level below or possibly above the second conductor so as to reduce the capacitive coupling therebetween. By staggering the second and third conductors, high density interconnect can be achieved with minimal propagation delay and cross coupling.

14 Claims, 5 Drawing Sheets

METHOD OF MAKING AN INTEGRATED CIRCUIT WHICH USES AN ETCH STOP FOR PRODUCING STAGGERED INTERCONNECT LINES

This is a continuation, of application Ser. No. 08/683,176, filed Jul. 18, 1996, now abandoned.

BACKGROUND OF THE INVENTION

1. Field of the Invention

This invention relates to semiconductor fabrication and more particularly to an integrated circuit which employs staggered interconnects formed using an etch stop. The interconnect lines are formed such that one interconnect line is configured in a plane dissimilar from, and laterally spaced between, a pair of interconnect lines. By staggering the interconnect lines, a higher density interconnect structure can be produced with minimal electric field coupling between the interconnect lines.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide").

Conductors are thereby lithography patterned across the semiconductor topography, wherein the topography comprises a substrate with a dielectric placed thereon. The topography can also include one or more layers of conductors which are covered by a dielectric material. The layers of conductors overlaid with a dielectric present a topography upon which a subsequent layer of conductors can be patterned.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and dialectically spaced above an underlying conductor or substrate by a dielectric thickness $T_{d1}$. Each conductor is dielectrically spaced from other conductors within the same level of conductors (i.e., substantially coplanar conductors) by a distance $Td_2$. Accordingly, capacitance between vertically spaced conductors, or intralevel capacitance CLS is determined as follows:

$$C_{LS} \approx eW_L L/T_{d1} \qquad \text{(Eq. 1)}$$

Further, capacitance between horizontally spaced, substantially coplanar conductors, or interlevel capacitance $C_{LL}$ is determined as follows:

$$C_{LL} \approx eT_c L/Td_{d2} \qquad \text{(Eq. 2)}$$

where e is the permitivity of the dielectric material (the dielectric material between the conductor and substrate or the dielectric material between conductors), $W_L$ is the conductor width, $T_c$ is the conductor thickness, and L is the conductor length. Resistance of the conductor is calculated as follows:

$$R=(rL)/W_L T_c \qquad \text{(Eq. 3)}$$

where r represents resistivity of the conductive material, and $T_c$ is the interconnect thickness. Combinations of equations 1 and 3, and/or equations 2 and 3 indicate as follows the propagation delay or coupling of a conductor to an adjacent conductor:

$$RC_{LS} \approx reL^2/T_c T_{d1}$$

$$RC_{LL} \approx reL^2/W_L T_{d2}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay and/or capacitive coupling be minimized as much as possible given the geometric constraints of the semiconductor topography.

In general, $C_{LS}$ is minimized by placing conductors within one level perpendicular to conductors in another level. However, conductors within the same elevational level cannot run perpendicular to one another since, to do so, would cause undesirable shorting to occur. To lower $C_{LL}$, lateral spacing must be maintained as large as possible between conductors on the same level. As circuit density increases, maintaining a proper amount of spacing becomes difficult. A challenge therefore exists to maintaining small die size but with large horizontal spacing between neighboring conductors.

Increases in CLL parasitic capacitance pose two major problems. First, an increase in parasitic capacitance generally causes an increase in the time at which a transition on the one end of the conductor occurs at the other end. Increase in transition time (i.e., increase in speed degregation) thereby requires a longer drive period. If the conductor extends along a critical speed path, speed degregation on the line will jeopardize functionality of the overall circuit. Second, a larger parasitic capacitance causes an increase in crosstalk noise. A conductor which does not transition, nonetheless receives crosstalk noise from neighboring lines which do.

It is thereby important to minimize propagation delay especially in critical speed paths and/or between conductors which are spaced close to one another. Geometric constraints make it difficult to increase conductor thickness $T_c$ or dielectric thickness $Td_2$. Still further, instead of reducing length L of a conductor, most modern integrated circuits employ longer interconnect lines which compound the propagation delay problems. Accordingly, a need arises for reducing propagation delay and cross coupling by somehow maximizing dielectric thickness $Td_2$ between conductors in the same elevational level. More specifically the desired configuration must be one which provides maximum spacing between densely arranged conductors, or conductors in critical speed paths.

SUMMARY OF THE INVENTION

Problems outlined above are in large part solved by an improved multilevel interconnect structure. The interconnect structure comprises a staggered arrangement of conductors configured at dissimilar elevational levels within an interlevel dielectric structure. The interconnect structure includes at least two dielectric layers. The two dielectric layers are interposed between a first set of coplanar conductors and a second set of coplanar conductors. In areas where the second level of conductors are densely formed, every other conductor can be placed on an elevational level dissimilar from the others. Accordingly, the second set of conductors can be defined as two sets of conductors, termed second and third conductors. According to one exemplary form, the third conductors are those which are staggered below the second conductors.

Staggering the second and third conductors rather than placing all the conductors on the same level achieves high density but without the problems associated with closely spaced conductors. By staggering the second and third conductors on different elevational levels, the distance between second and third conductors is increased thereby decreasing parasitic capacitance problems.

The multilevel interconnect structure further includes one or more contacts extending between the first and second sets of conductors. The third conductor is spaced from the contact and configured exclusively within one of the pair of dielectrics (or within one of possibly three or more dielectric layers). The third conductor extends from an etch stop at the base of the third conductor to the upper surface of the interconnect dielectric structure. Alternatively, the third conductor can extend through an opening within the etch stop to the lower surface of the interconnect dielectric structure—i.e., to the first conductor. Thus, the opening (or hole) within the etch stop layer becomes a contact which connects the first and third conductors. The third conductor is preferably formed from the same material and as the contacts, and the second set of conductors is formed from the same material as the first set of conductors. The etch stop material, a suitable material comprising titanium nitride(TiN) or silicon nitride, is patterned after the first dielectric layer is deposited. The etch stop material serves to terminate etching at the upper surface of the etch stop. Thus, when a trench is formed, the trench extends only through the second dielectric layer to the upper surface of the etch stop. The trench opening thereafter allows fill material (i.e., plug material) to be placed therein. The plug material is then processed such that the plug material within the trench comprises a third conductor. Thickness of the second dielectric can thereby determine the thickness of the third conductor. If greater current-carrying capacity is desired, the second dielectric thickness can be adjusted accordingly.

Broadly speaking, the present invention contemplates a method for forming a multilevel interconnect structure. The method includes the steps of forming at least two first conductors spaced across a semiconductor topography. A first dielectric layer is then deposited upon the first conductors. An etch stop is then formed upon a portion of the first dielectric, and a second dielectric layer is deposited upon the etch stop. The second dielectric is then etch removed only in regions directly above the etch stop to form a trench while simultaneously etch removing the second and first dielectrics in regions directly above the first conductors to form a pair of vias. The trench and vias are then filled with the plug material. A filled trench comprises a third conductor. The second conductor is then formed across the second dielectric.

The present invention further contemplates a multilevel interconnect structure, comprising a first pair of conductors arranged on a first plane and a second pair of conductors arranged on a second plane. A pair of dielectric layers are configured between the first and second planes. A contact is dimensioned to extend through the pair of dielectric layers from one of the first pair of conductors to one of the second pair of conductors. A third conductor extends through only one of the pair of dielectrics a parallel, laterally spaced distance relative to the contact from a plane intermediate the first and second planes.

BRIEF DESCRIPTION OF THE DRAWINGS

Other objects and advantages of the invention will become apparent upon reading the following detailed description and upon reference to the accompanying drawings in which.

Figure 1:
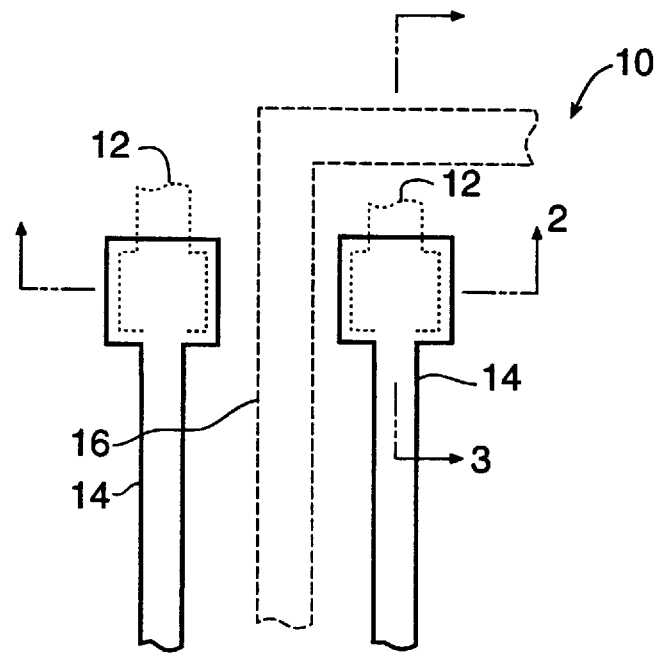
FIG. 1 is a top plan view of a multilevel interconnect structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a multi-level interconnect structure 10. Structure 10 comprises conductors placed on at least three separate layers. According to the exemplary illustration, structure 10 includes a first set of conductors 12 placed coplanar to each other, a coplanar second set of conductors 14 and a coplanar third set of conductors 16 placed intermediate conductors 12 and 14. For sake of brevity, only a single third conductor 16 is shown. However, it is understood that third conductor 16 exists a lateral distance between closely spaced second conductors 14. To the extent there are more than two second conductors, and likely there are, then third conductor 16 exists in alternative fashion between pairs of second conductors 14. The various elevational levels occupied by first, second and third conductors is better illustrated in reference to FIG. 2.

Figure 2:
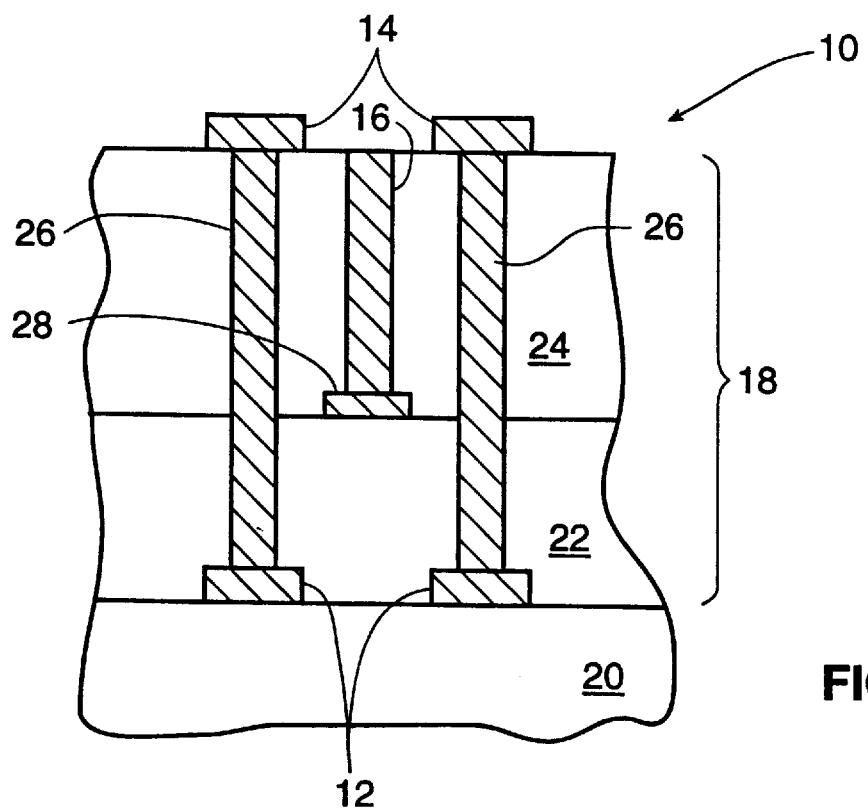
FIG. 2 is a cross-sectional view along plane 2 of FIG. 1.

FIG. 2 depicts a cross-sectional view along plane 2 of FIG. 1. Shown in the cross-section is an interlevel dielectric structure 18 placed upon a semiconductor topography 20. Semiconductor topography 20 includes, according to one embodiment, a dielectric-covered silicon substrate. According to another embodiment, topography 20 includes a dielectric-covered level or levels of conductors.

Interlevel dielectric structure 18 includes at least two dielectric layers, i.e., first dielectric 22 and second dielectric 24. First dielectric 22 is deposited upon topography 20, and second dielectric 24 is deposited upon first dielectric 22. First and second dielectrics 22 and 24 are preferably deposited either from a silane or TEOS source, according to known dielectric deposition techniques. Placed within and upon dielectric structure 18 is first conductors 12, second conductors 14 and contacts 26 extending between select ones of conductors 12 and 14. Also placed solely within second dielectric 24 is third conductor 16. The various steps used in forming interconnect structure 10 will be described in reference to FIGS. 4–13.

FIGS. 1 and 2 depict certain spacing distances between first, second and third conductors 12, 14 and 16, respectively. By staggering conductors 14 and 16, the effective spacing therebetween is enhanced. The effective spacing is calculated from the midpoint of each conductor, whereby staggering of conductors thereby increases the effective spacing. Increase in effective spacing decreases electric field, hence the capacitive coupling.

Figure 3:
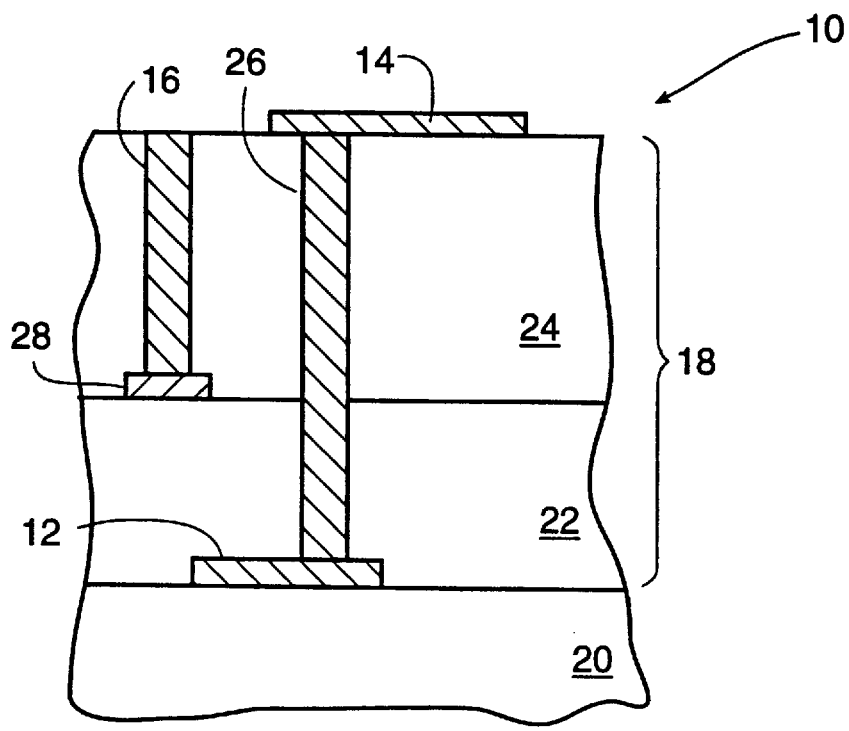
FIG. 3 is a cross-sectional view along plane 3 of FIG. 1.
Figure 4:
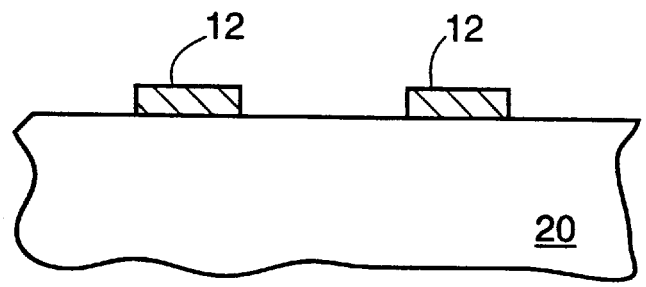
FIG. 4 is a cross-sectional view of a semiconductor topography along plane 2 showing formation of first conductors (interconnect) within a first elevational level.

FIG. 3 illustrates multilevel interconnect structure 10 along plane 3 of FIG. 1. Shown in FIG. 3 is interlevel dielectric structure 18, first and second dielectrics 22 and 24, first conductor 12, second conductor 14, third conductor 16 and contact 26.

Turning now to FIGS. 4-13, a series of processing steps are shown in accordance with the cross-sectional plane 2 of FIG. 1. Beginning with FIG. 4, first conductors 12 are patterned upon semiconductor topography 20. Patterning of first conductors 12 is carried forth by depositing a conductive material across topography 20, and thereafter removing unwanted regions of the conductive layer using well-known lithography techniques. First conductors 12 can be formed either directly upon topography 20 or, in the alternative, formed on a barrier layer (not shown). The barrier layer, comprising Ti/TiN can be used to enhance the adhesion of refractory metal within first conductor 12 to a dielectric layer upper surface.

Figure 5:
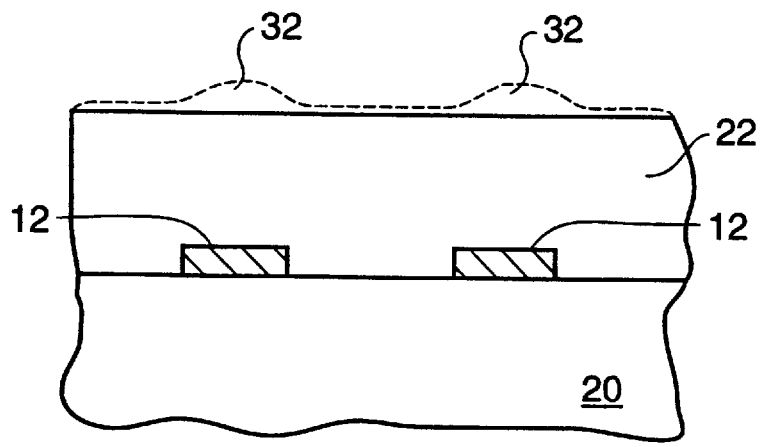
FIG. 5 is a cross-sectional view of a processing step subsequent to that shown in FIG. 4, wherein a first layer of dielectric is formed upon the first interconnect.

FIG. 5 illustrates deposition of first dielectric layer 22 upon and between first conductors 12. Dielectric 22 is preferably chemical-vapor deposited (CVD) or PECVD across topography 20 and first conductors 12. Any peaks 32 which might exist after deposition can be subsequently removed using various planarization techniques.

Figure 6:
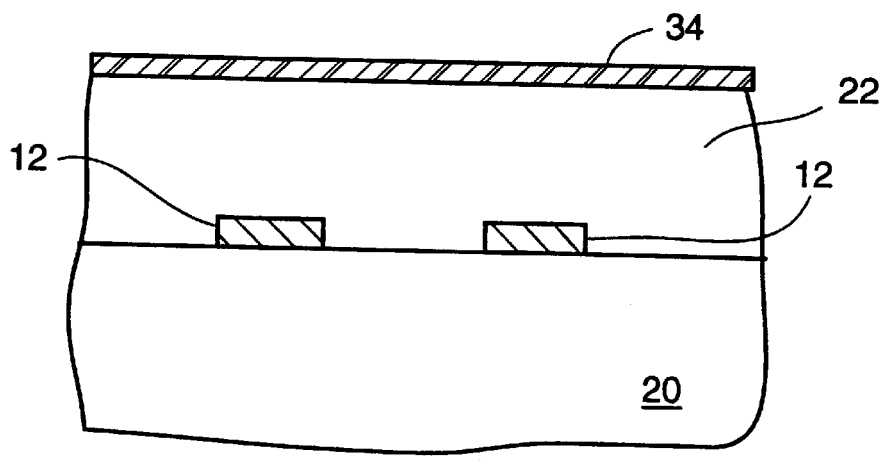
FIG. 6 is a cross-sectional view of a processing step subsequent to that shown in FIG. 5, wherein an etch stop material is deposited upon the first layer of dielectric.

FIG. 6 indicates blanket deposition of an etch stop layer 34 upon first dielectric layer 22. Layer 34 includes any material which etches at a slower rate than dielectric 22. Layer 34 preferably includes material such as titanium nitride (TiN) or silicon nitride ($Si_3N_4$). Layer 34 is preferably deposited to a thickness sufficient for stopping the etch at this layer, while etching through dielectric 22 to open up contacts to conductor 12.

Figure 7:
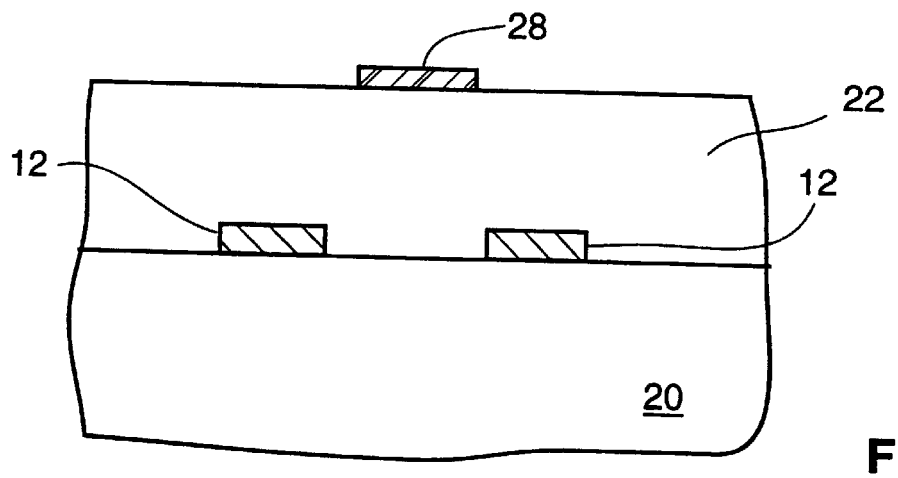
FIG. 7 is a cross-sectional view of a processing step subsequent to that shown in FIG. 6, wherein the etch stop material is selectively removed.
Figure 8:
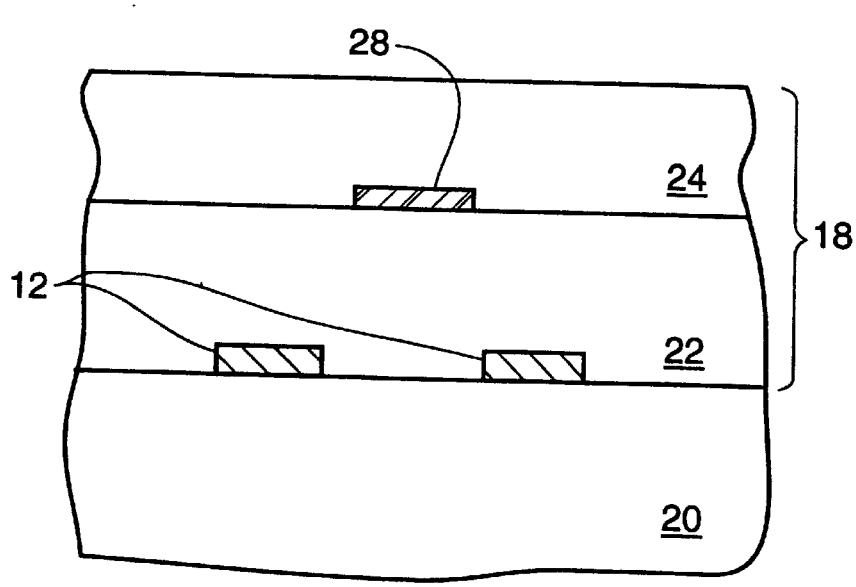
FIG. 8 is a cross-sectional view of a processing step subsequent to that shown in FIG. 7, wherein a second layer of dielectric is formed upon and between the patterned etch stop material.

FIG. 7 depicts patterning of layer 34 to present an etch stop 28. Etch stop 28 is thereby shown as placed above and between first conductors 12. FIG. 8 illustrates a subsequent step in which second dielectric 24 is deposited upon first dielectric 22 and etch stop 28. A combination of first and second dielectrics 22 and 24 comprise interlevel dielectric structure 18.

Figure 9:
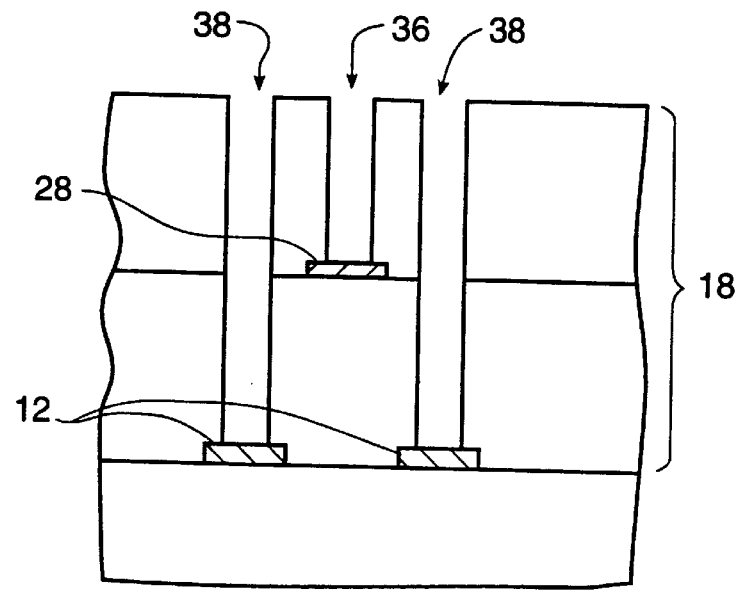
FIG. 9 is a cross-sectional view of a processing step subsequent to that shown in FIG. 8, wherein vias are formed within the first and second layers of dielectric and a trench is formed within the second layer of dielectric.

FIG. 9 illustrates etch removal of select portions of interlevel dielectric structure 18. Specifically, a projection mask is used, as well as photoresist, to remove regions directly above etch stop 28 and a select set of first conductors 12. The removed area above etch stop 28 is depicted as trench 36, and the removed areas above first conductors 12 are depicted as vias 38. Etch stop 28 and first conductors 12 serves to terminate etch at their respective upper surfaces. Thus, select removal of interlevel dielectric structure 18 occurs in accordance with, and in alignment over, the underlying features previously established (i.e., first conductors 12 and etch stop 28).

Figure 10:
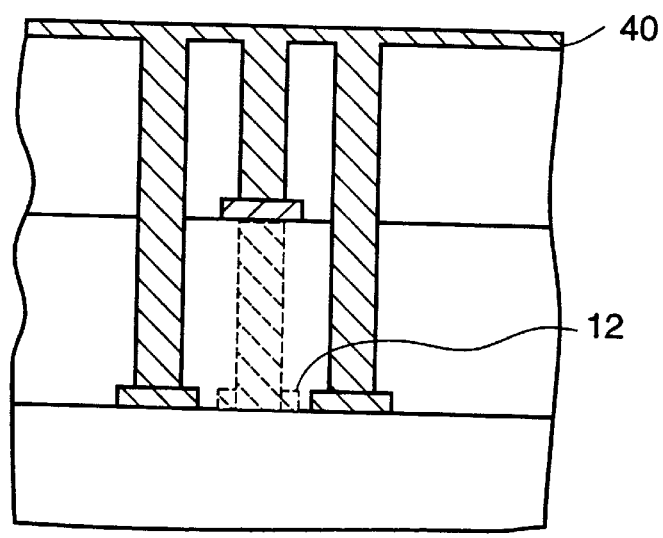
FIG. 10 is a cross-sectional view of a processing step subsequent to that shown in FIG. 9, wherein the vias and trench are filled with a plug material.
Figure 11:
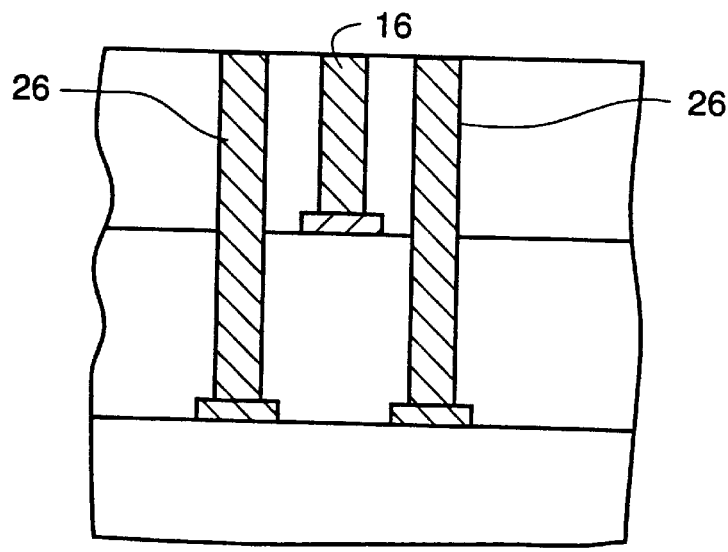
FIG. 11 is a cross-sectional view of a processing step subsequent to that shown in FIG. 10, wherein the plug material is removed from the second layer of dielectric to form a third conductor within the trench and contacts within the vias.

FIG. 10 illustrates a processing step in which plug material is deposited along with a barrier layer (such as Ti/TiN) into vias 38 and trench 36. The plug material is denoted as reference 40. A suitable plug material includes tungsten, aluminum, copper, for example. According on one embodiment, an opening can be configured within etch stop structure 28. The opening allows for plug material 40 to extend through the etch stop and to first conductor 12. Thus, an opening within etch stop structure 28 affords electrical connection between the first, second and third conductors. FIG. 11 illustrates subsequent removal of plug material from the upper surface of dielectric structure 18.

After material 40 is removed from the upper surfaces, discrete contacts 26 are formed. Moreover, removal of material 40 causes formation of third conductor 16. Third conductor 16 thereby is formed from the same material as that used to produce contacts 26. Third conductor 16 may also include aluminum, however, tungsten appears a more suitable material as an interlevel plug, and thereby is suitably used as the third conductor.

Figure 12:
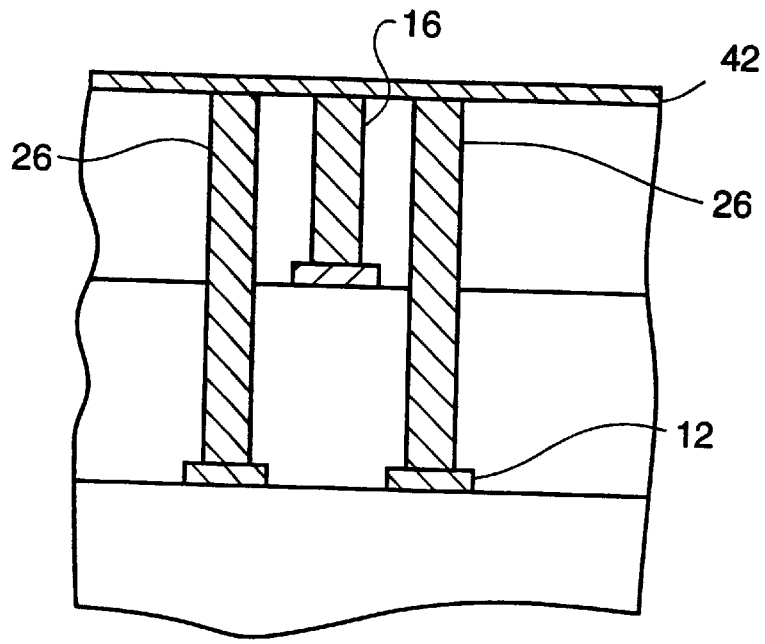
FIG. 12 is a cross-sectional view of a processing step subsequent to that shown in FIG. 11, wherein a layer of metal is deposited upon the third conductor and contacts, according to an exemplary embodiment.
Figure 13:
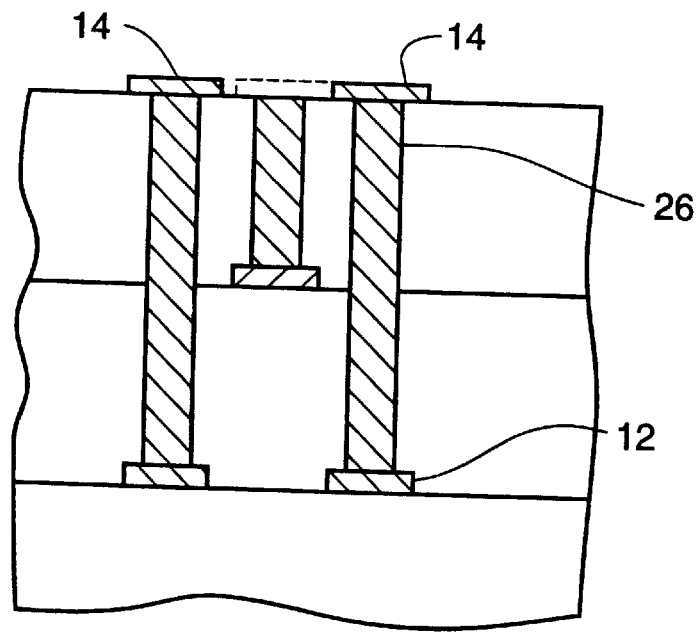
FIG. 13 is a cross-sectional view of a processing step subsequent to that shown in FIG. 12, wherein the layer of metal is selectively removed to form a second set of conductors and complete the exemplary multilayer interconnect structure shown in FIG. 1.

FIG. 12 illustrates blanket deposition of another conductive material 42. Conductive material suitably includes aluminum or its alloys. Material 42 is blanket deposited across the entire interlevel dielectric structure 18, as well as upon contacts 26 and third conductor 16. In a subsequent processing step, FIG. 13 depicts select removal of conductive material 42 to form second conductors 14.

Merely as an example, second conductors are formed over contacts 26, wherein contacts 26 electrically link second conductors 14 to first conductors 12. It is understood, however, that contacts 26 need not exist between all first and second conductors 12 and 14, and that only a select few of those conductors are electrically linked. It is also understood that second conductor 14 may extend upon third conductor 16, if an electrical link therebetween is desired.

It is understood that the sequence of steps shown in FIGS. 4–13 can be repeated to produce multiple staggered interconnect structures. It is understood that the invention shown and described is to be taken as presently preferred embodiments. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, specification and drawings are to be regarded in an illustrative rather than a restrictive sense.

What is claimed is:

1. A method for forming a multilevel interconnect structure, comprising:

forming at least two first conductors spaced across a semiconductor topography;

depositing a first dielectric upon said first conductors;

forming an etch stop upon a portion of said first dielectric;

depositing a second dielectric upon said etch stop;

etching through said second dielectric directly above said etch stop to form a trench while simultaneously etching through said second and first dielectrics directly above said first conductors to form a pair of vias;

filling said trench and said vias with a plug material; and forming at least two second conductors spaced across said second dielectric.

2. The method as recited in claim 1, wherein said forming an etch stop comprises:

depositing a layer of etch stop material across said first dielectric; and removing portions of the layer of etch stop material to present an etch stop arranged a spaced distance above said first conductors.

3. The method as recited in claim 1, wherein said etching to form the trench comprises removing only said second dielectric while retaining said etch stop therebelow.

4. The method as recited in claim 1, wherein said forming an etch stop comprises patterning a geometric shape having an opening near the center of said geometric shape.

5. The method as recited in claim 1, wherein said etching to form the pair of vias comprises removing said second dielectric followed by said first dielectric within defined regions laterally displaced from said etch stop.

6. The method as recited in claim 1, wherein said filling the trench results in a third conductor interposed at an elevational level between a plane formed by the first conductors and a plane formed by the second conductors.

7. The method as recited in claim 1, wherein said filling the trench results in a third conductor interposed in a plane dissimilar from the first conductors and the second conductors, and wherein the third conductor is laterally displaced between two of the second conductors.

8. The method as recited in claim 1, wherein said filling the vias comprises forming a contact extending between one of said second conductors and one of said first conductors.

9. The method as recited in claim 7, wherein said forming the second conductors comprises selectively removing metal from said second dielectric including areas where said third conductor exists such that the remaining metal extends over one of the filled said vias.

10. The method as recited in claim 7, wherein a portion of one of said second conductors extends a spaced distance above a portion of said third conductor.

11. A method for forming a multi-level interconnect structure, comprising:

forming a pair of dielectrics upon a first set of coplanar conductors;

forming a trench partially through said pair of dielectrics while simultaneously forming a via entirely through said pair of dielectrics to said first set of coplanar conductors;

filling said trench and said via with a tungsten plug to produce a third conductor and a contact, respectively;

depositing a layer of metal across said pair of dielectrics, including said third conductor and said contact; and removing portions of said layer of metal to produce a second set of coplanar conductors arranged directly upon said third conductor and said contact.

12. The method as recited in claim 11, wherein said forming the trench comprises etching only one of said pair of dielectrics to an etch stop placed between the pair of dielectrics.

13. The method as recited in claim 12, wherein the etch stop is placed at a midline between an upper surface and a lower surface of said pair of dielectrics.

14. The method as recited in claim 11, wherein said step of filling said trench and via with a tungsten plug comprises:

depositing a layer of tungsten across said pair of dielectrics and within said trench and said via to an elevational level above an upper surface of said pair of dielectrics; and removing said layer of tungsten to a level commensurate with the upper surface of said pair of dielectrics.

* * * * *